United States Patent [19]

Kokubun

[11] Patent Number: 5,148,397
[45] Date of Patent: Sep. 15, 1992

[54] SEMICONDUCTOR MEMORY WITH EXTERNALLY CONTROLLED DUMMY COMPARATOR

[75] Inventor: Hitoshi Kokubun, Tokyo, Japan

[73] Assignee: Oki Electric Industry Co. Ltd., Japan

[21] Appl. No.: 664,404

[22] Filed: Mar. 4, 1991

Related U.S. Application Data

[63] Continuation-in-part of Ser. No. 492,946, Mar. 13, 1990, abandoned.

[30] Foreign Application Priority Data

Mar. 16, 1989 [JP] Japan .................................. 1-64198

[51] Int. Cl.$^5$ .............................................. G11C 7/00
[52] U.S. Cl. .......................... 365/189.07; 365/189.09; 365/185; 365/201; 365/208; 365/210; 365/226
[58] Field of Search ............... 365/210, 185, 207, 208, 365/201, 226, 189.07, 189.09

[56] References Cited

U.S. PATENT DOCUMENTS

| | | | |
|---|---|---|---|
| 4,680,762 | 7/1987 | Hardee et al. | 371/28 |
| 4,761,765 | 8/1988 | Hashimoto | 365/185 |
| 4,799,195 | 1/1989 | Iwahashi et al. | 365/210 |
| 4,802,138 | 1/1989 | Shimamune | 365/210 |
| 4,817,052 | 3/1989 | Shinoda et al. | 365/210 |
| 4,974,207 | 11/1990 | Hashimoto | 365/210 |

Primary Examiner—Joseph E. Clawson, Jr.
Attorney, Agent, or Firm—Edward D. Manzo

[57] ABSTRACT

A semiconductor memory which is capable of measuring a threshold voltage in a memory cell. The semiconductor memory comprises memory arrays having a plurality of memory cells arranged in a matrix, means for selecting the memory cell, and a sense amplifier for comparing a current flowing through the selected memory cell with a current flowing through a dummy cell and provides an output indicative of a resultant comparison value. The memory cells each include a first switching means having a first transconductance at the time "1" is written in the memory cell and having a second transconductance at the time "0" is written in the memory cell, the value of the second transconductance being greater than the value of the first transconductance. The dummy memory cell includes a second switching means having a third transconductance value of which is in the middle between values of the first and the second transconductance. The memory cells and the dummy cell each have a gate coupled to respective external terminals. A selected one of the terminals receives increasing voltage.

22 Claims, 5 Drawing Sheets

SEMICONDUCTOR MEMORY WITH EXTERNALLY CONTROLLED DUMMY COMPARATOR

This is a continuation-in-part of copending application Ser. No. 07/492,946, filed on Mar. 13, 1990, now abandoned.

BACKGROUND OF THE INVENTION

The present invention relates to a semiconductor memory capable of measuring a threshold voltage in a memory cell, more particularly to an electrically erasable and programmable read only memory (hereinafter referred to as EEPROM) capable of measuring the threshold voltage in the memory cell in which a data "1" and a data "0" (hereinafter referred to simply as "1" or "0") are written.

In a screening process of the EEPROM. it is important to measure the threshold voltage of the EEPROM element constituting the memory cell.

The EEPROM has a source, a drain, a floating gate and a control gate wherein "1" or "0" is written therein by charging positively or negatively. When the data is read out from the EEPROM, a predetermined voltage is applied to the control gate. Assume that "0" is written in the EEPROM if a current which is greater than the threshold current (It) flows between the source and the drain and "1" is written in the EEPROM if a current which is less than the threshold current between the source and the drain.

When the voltage to be applied to the control gate is increased, the current to flow between the source and the drain is proportionally increased.

The threshold voltage is defined as the voltage to be applied to the control gate of the EEPROM element in which "1" is written when the same voltage is increased from zero volt so that the current to flow between the source and the drain reaches the threshold current (It).

It is possible as evident from the above explanation to measure the threshold voltage of the EEPROM element in which "1" is written. However, it is impossible to measure the threshold voltage of the EEPROM element in which "0" is written.

SUMMARY OF THE INVENTION

It is an object of the present invention to provide an EEPROM capable of measuring a threshold voltage of an EEPROM element in which "0" is written.

It is a further object of the present invention to provide an EEPROM capable of accurately measuring threshold voltages of all the EEPROM elements.

It is a still further object of the present invention to provide an EEPROM having a dummy cell for measuring a threshold voltage of an EEPROM element.

To achieve the above objects of the present invention, the EEPROM comprises memory arrays having a plurality of memory cells arranged in a matrix arrangement, namely, in cross-match fashion, the memory cells each including a first switching means having a first conduction capacitance at the time "1" is written in the memory cell and having a second transconductance at the time "0" is written in the memory cell, the value of the second transconductance being greater than the value of the first transconductance, means for selecting the memory cell, a dummy memory cell including a second switching means having a third transconductance, the value of the third transconductance being between the values of the first and the second transconductance, and a sense amplifier for comparing a current flowing through the selected memory cell with a current flowing through the dummy cell and provides an output indicative of a resultant comparison value.

The above and other objects, features and advantages of the present invention will become more apparent from the following description taken in conjunction with the accompanying drawings.

DESCRIPTION OF THE PREFERRED EMBODIMENT

Figure 1:
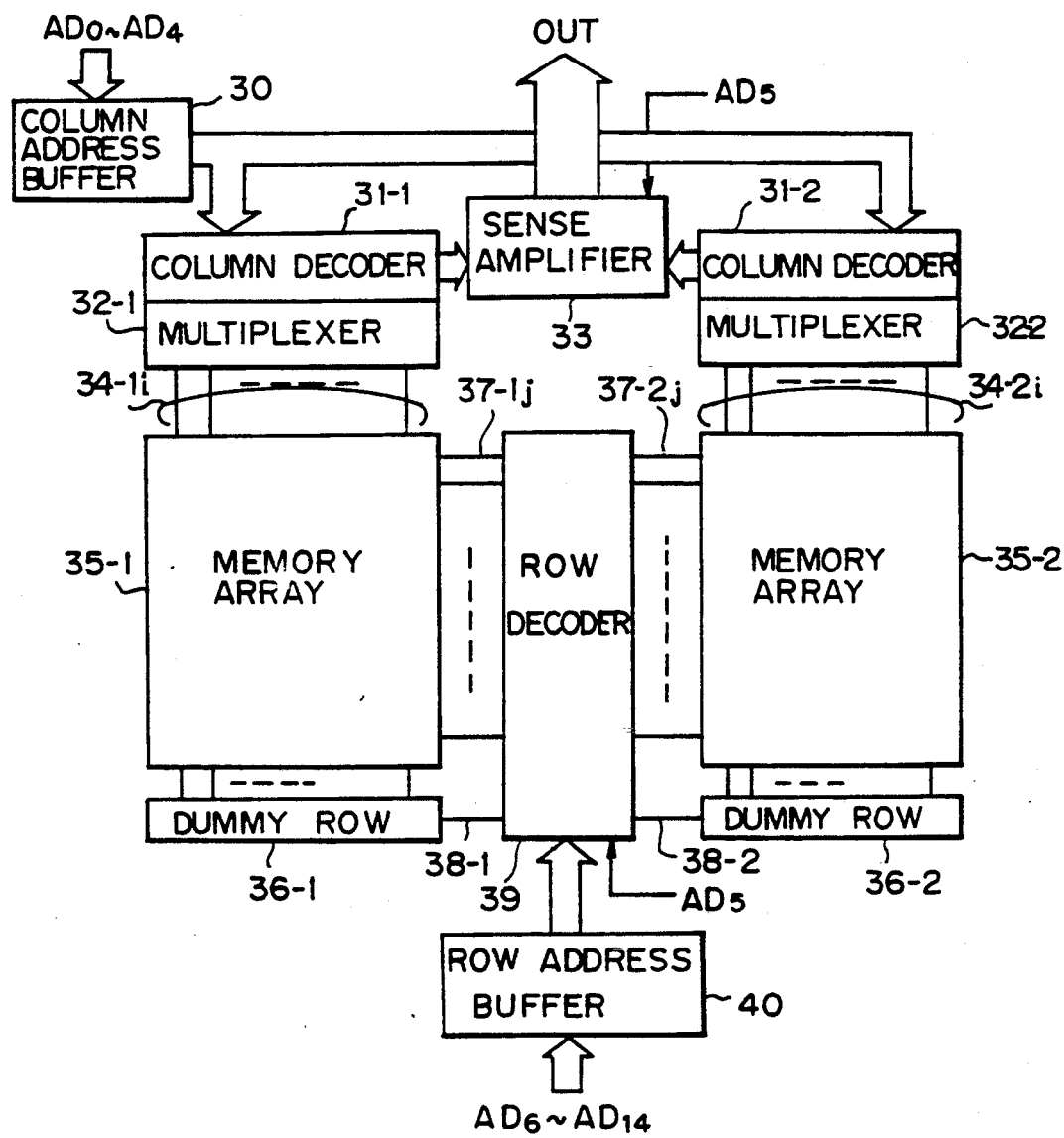
FIG. 1 is a block diagram of an EEPROM according to a first embodiment of the present invention.
Figure 2:
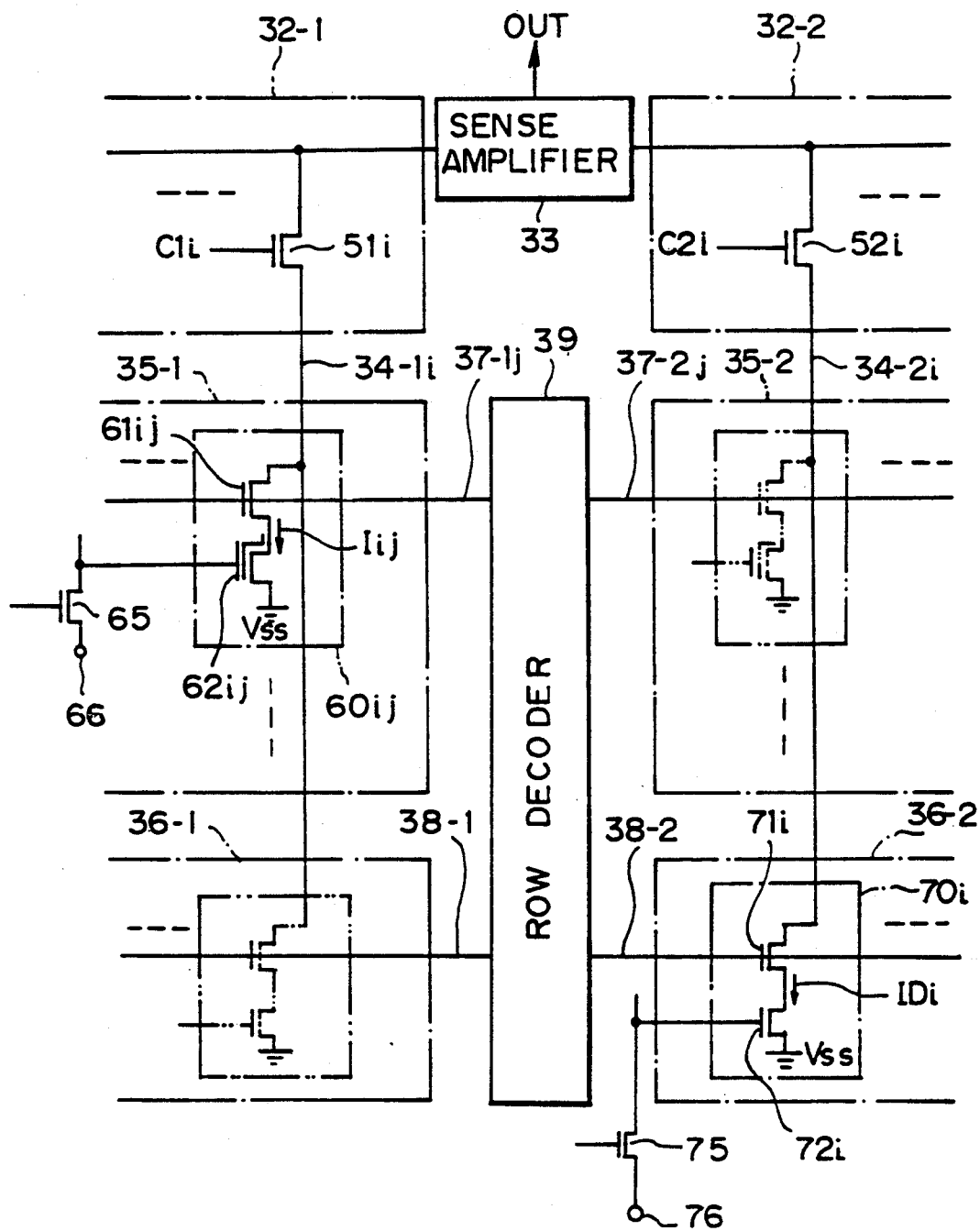
FIG. 2 is a circuit diagram showing a principal portion of the EEPROM of FIG. 1.

First Embodiment (FIGS. 1 to 2)

A semiconductor memory cell, especially, an EEPROM of 256 Kbits (32 Kbits×8) according to a first embodiment of the present invention will be described with reference to FIGS. 1 to 2.

The EEPROM has a column address buffer 30 for selecting column addresses to which are supplied five addresses AD0 to AD4 among fifteen addresses AD0 to AD14 needed to select 32 Kbits. An output of the column address buffer 30 is respectively connected to a first column decoder 31-1, a first multiplexer 32-1, a second column decoder 31-2 and a second multiplexer 32-2. Outputs of the first and the second multiplexers 32-1, 32-2 are respectively connected to a differential sense amplifier 33. The first and the second column decoders 31-1, 31-2 are provided for selecting every one byte for each first and second multiplexers 32-1, 32-2. The sense amplifier 33 differentially amplifies data stored in a pair of column lines selected by the first and the second multiplexers 32-1, 32-2 to thereby provide an output OUT indicative of a signal "1" or a signal "0".

The first multiplexer 32-1 is connected to a first memory array 35-1 occupying a left portion of the entire memory array by way of a plurality of column lines 34-1$i$. The second multiplexer 32-2 is connected to a second memory array 35-2 occupying a right portion of the entire memory array by way of a plurality of column lines 34-2$i$. The column lines 34-1$i$, 34-2$i$ are respectively connected to first and second dummy rows 36-1, 36-2 each composed of a group of one row dummy memory cells. The first and the second memory arrays 35-1, 35-2 are respectively connected to a row decoder 39 by way of row lines 37-1$j$, 37-2$j$ for transmitting 512 bits selected signals. The first and the second dummy rows 36-1, 36-2 are respectively connected to the row decoder 39 by way of first and second selected signal transmitting dummy lines 38-1, 38-2. The row decoder 39 is connected to a row address buffer 40 for receiving the row addresses AD6–AD14.

The address AD5 among the fifteen addresses AD0 to AD14 is used for selecting the first memory array 35-1 or the second memory array 35-2 and connected to the sense amplifier 33 and the column decoder 39. In the case the address AD5 is "0", the first row line 37-1j and the second dummy row line 38-2 are respectively selected by the column decoder 39. Or, in the case the address AD5 is "1", the second row line 37-2j and the first dummy row line 38-1 are respectively selected. Assume that, in the case the address AD5 is "0", a reference input of the sense amplifier 33 is based on the data in the second memory cell 35-2 while, in the case the address AD5 is "1", the reference input of the sense amplifier 33 is based on the data in the first memory cell 35-1.

When the data is read out from one of memory cells in the memory array as illustrated in FIG. 1, the addresses AD0-AD4 are supplied to the column address buffer 30 and the addresses AD6 to AD14 are supplied to the row address buffer 40 and the address A5 (="0") is supplied to the sense amplifier 33 and the row decoder 39.

The addresses AD0 to AD4 are supplied to the first and the second column decoders 31-1, 31-2 by way of the column address buffer 30. The first and the second column decoders 31-1, 31-2 respectively give instructions to the first and the second multiplexers 32-1, 32-2 by way of the addresses AD0 to AD4. The first and the second multiplexers 32-1, 32-2 each select one column line 34-1i. 34-2i by the instructions given by the first and the second column decoders 31-1, 31-2. The addresses AD6 to AD14 are supplied to the row decoder 39 by way of the row address buffer 40. The row decoder 39 selects the first row line 37-1j and the second dummy row line 38-2. The memory cell selected in the first memory array 35-1 is connected to the input of the sense amplifier 33 by way of the column line 34-1j and the first multiplexer 32-1. The dummy memory cell selected in the second dummy row 36-2 is connected to the other input of the sense amplifier 33 by way of the column line 34-2i and the second multiplexer 32-2. Whereupon, the sense amplifier 33 differentially amplifies the both inputs and provides a signal OUT indicative of a readout data "1" or a readout data "0".

FIG. 2 is a circuit diagram showing a relationship of connection between the selected memory cell and dummy memory cell.

The first multiplexer 32-1 comprises a plurality of NMOS transistors 51i each having a gate to which the selected signal C1i provided by the first column decoder 31-1 is supplied The second multiplexer 32-2 comprises a plurality of NMOS transistors 52i each having a gate to which the selected signal C2i provided by the second column decoder 31-2 is supplied.

In the case the address AD5="0", the row decoder 39 selects the second dummy row line 38-2 as well as the first row line 37-1j. A memory cell 60ij in the first memory array 35-1 is connected at the portion where the first row line 37-1j and the column line 34-1j cross. The memory cell 60ij comprises an NMOS transistor (EEPROM element) 62ij for storing therein the data and having a floating gate and an NMOS transistor 61ij for selecting the transistor 62ij. The transistors 61ij, 62ij are connected in series between the column line 34-1i and a ground potential $V_{ss}$. The transistor 61ij is connected to the row line 37-ij at the gate thereof and the transistor 62ij is connected at a control gate thereof to an external terminal 66 by way of a NMOS transistor 65 for supplying a power supply. A voltage to be supplied to the control gate of the transistor 62ij controls a current Iij flowing between a source and a drain of the transistor 62ij.

A dummy memory cell 70i is connected at the portion where the second dummy row line 38-2 and the column line 34-2i cross. The dummy memory cell 70i comprises an NMOS transistor 72i and an NMOS transistor 71i for selecting the transistor 72i. The transistors 72i, 71i are connected in series between the column line 34-2i and a ground potential $V_{ss}$. The transistor 71i is connected to the dummy row line 38-2 at the gate thereof and the transistor 72i is connected at a control gate thereof to an external terminal 76 by way of an NMOS transistor 75 for supplying a power supply. A voltage to be supplied to the control gate of the transistor 72i controls a current IDi flowing in the dummy memory cell 70i.

In case of applying a predetermined voltage, e.g. 2 V, to the control gate of the transistor 62ij, a transconductance of the transistor 72i is so designed that it is set to be a middle value, preferably an average value between the transconductance of the transistor 62ij in which "1" is written and the transconductance of the transistor 62ij in which "0" is written.

An operation of the EEPROM as illustrated in FIG. 2 will be described with reference to the following mode table.

| Mode | Voltage to be applied to the gate of transistor 62ij | Voltage to be applied to the gate of transistor 72i |
| --- | --- | --- |
| Readout | Vr | Vr |
| Measurement of threshold of transistor 62ij in which "1" is written | Vm1 | Vr |
| Measurement of threshold of transistor 62ij in which "0" is written | Vr | Vm2 |

(1) Readout Mode

In an ordinary readout mode, a constant voltage (e.g. 2 V) generated inside the EEPROM is applied to both gates of the transistors 62ij, 72i. Upon reception of the constant voltage, the transistor 62ij is turned off in case that "1" is written therein and turned on in case that "0" is written therein. Likewise, the transistor 72i is turned on, but the current IDi flowing between the source and the drain of the transistor 72i is about half the current Iij flowing between the source and the drain of the transistor 62ij when it is turned on. The sense amplifier 33 provides the signal OUT indicative of "1" when the current Iij flowing in the selected memory cell 60ij is less than the current IDi flowing in the dummy memory cell 70i but provides the signal OUT indicative of "0" when the current Iij flowing in the memory cell 60ij is greater than the current IDi flowing in the dummy memory cell 70i.

(2) Measuring Mode of the Transistor 62ij in which "1" is written

Figure 5:
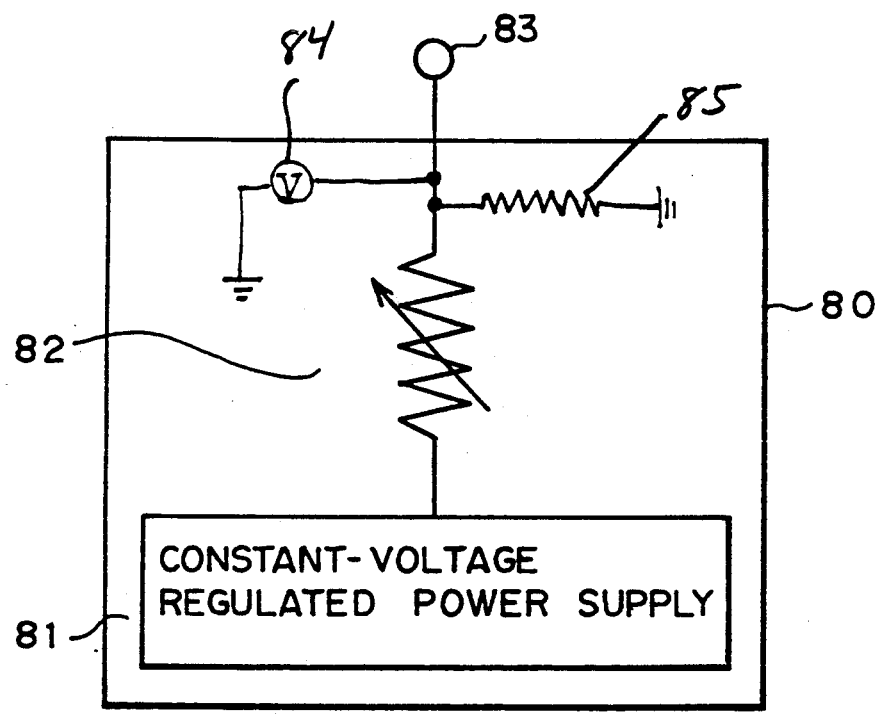
FIG. 5 is a circuit diagram of a variable voltage application means.

In case of measuring a threshold voltage Vt1 of the transistor 62ij in which "1" is written, a constant voltage Vr is applied to the gate of the transistor 72i same as in the readout mode and a variable voltage Vm1 is applied to the gate of the transistor 62ij by a variable voltage application means 80 as illustrated by FIG. 5 by way of the external terminal 66 and the transistor 65.

The variable voltage application means 80 comprises a constant-voltage regulated power supply 81, a variable resistor 82 and an output terminal 83. To generate variable voltage, the variable voltage generator 80 can generate a divided constant voltage through the output terminal 83 corresponding to the ratio of the variable resistor and the constant resistor 85. The divided constant voltage from the variable voltage generator 80 is variable according to the variation of the variable resistor. A voltmeter 84 is used to measure the variable voltage generated by the variable voltage generator 80. In case the variable voltage Vm1 is 2 V(=Vr), the transistor 62$ij$ is turned off and the current I$ij$ flowing between the source and the drain of the transistor 62$ij$ becomes substantially zero. As the variable voltage Vm1 is increased, the transistor 62$ij$ is turned on, the signal OUT provided by the sense amplifier 33 is inverted from "1" to "0" at the time when the current I$ij$ flowing between the source and the drain of the transistor 62$ij$ exceeds the current IDi flowing in the dummy memory cell 70$i$. Assume that the variable voltage Vm1 at this state is the threshold voltage Vt1 of the transistor 62$ij$ in which "1" is written. The threshold voltage is evaluated as one of the characteristic values for selecting, namely, screening the memory cell 60$ij$.

(3) Measuring Mode of the Transistor 62$ij$ in which "0" is written

In case of measuring the threshold voltage Vt0 of the transistor 62$ij$ in which "0" is written, a constant voltage Vr (=2 V) is applied to the gate of the transistor 62$ij$ and the variable voltage Vm2 is applied to the gate of the transistor 72$i$ by the variable voltage application means 80 as illustrated in FIG. 5 by way of the external terminal 76 and the transistor 75. When the variable voltage Vm2 is close to the constant voltage Vr (=2 V), the sense amplifier 33 provides "0" since the current I$ij$ is greater than the current IDi.

When the variable voltage Vm2 is gradually increased from 2 V, the current IDi flowing in the transistor 72$i$ is increased and the output provided by the sense amplifier 33 is inverted from "0" to "1" at the instant when the current IDi exceeds the current I$ij$. Assume that the voltage Vm2 at this state is a threshold voltage Vt0 of the transistor 62$ij$ in which "0" is written. The threshold voltage Vt0 is considered to be another characteristic value of the memory cell 60$ij$.

As mentioned above, it is possible to measure both the threshold voltages Vt1, Vt0 of the memory cell 60$ij$ in which "1" is written and "0" is written whereby the evaluation of selection, namely, screening of the memory cell can be made with high accuracy.

Figure 3:
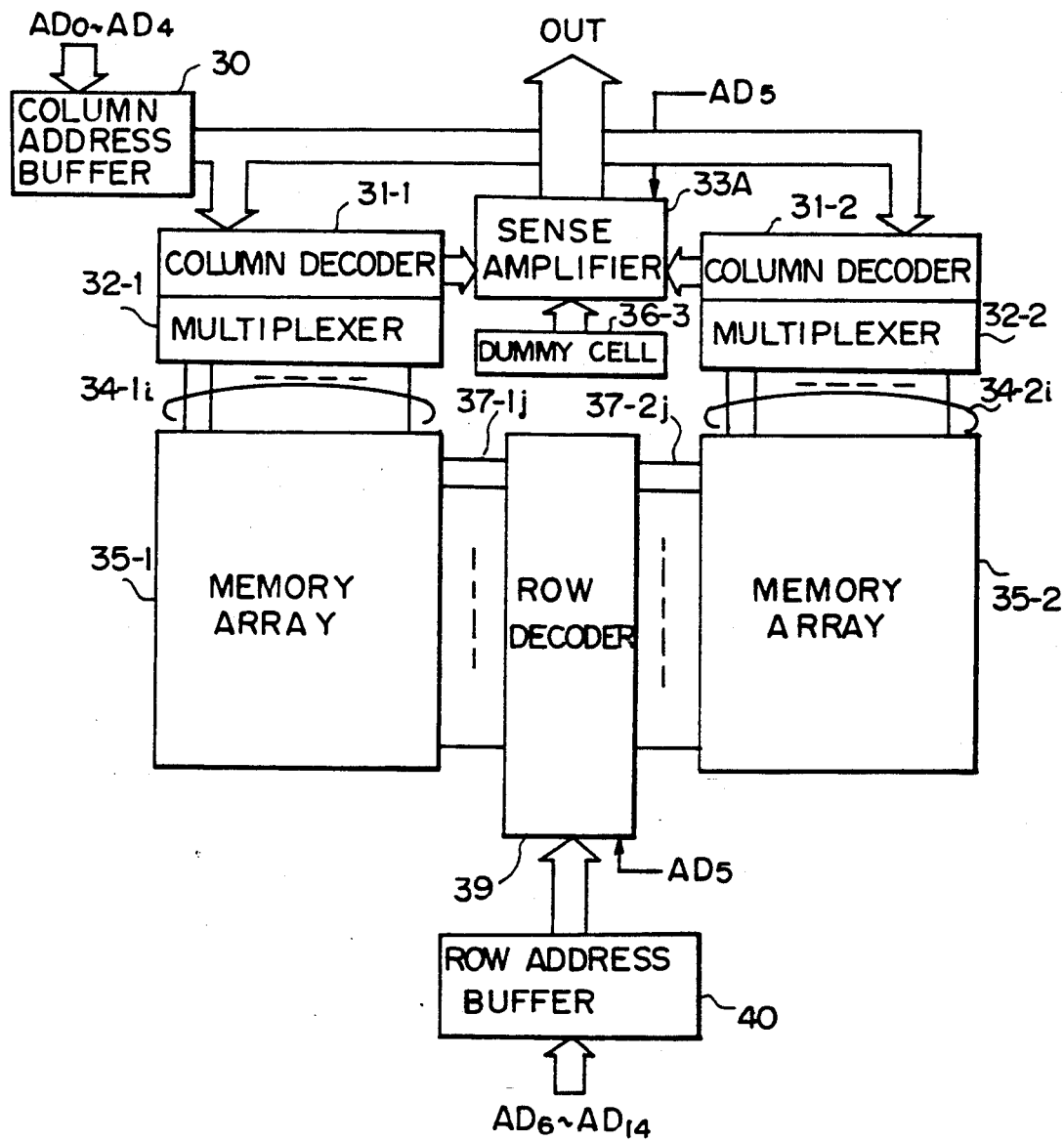
FIG. 3 is a block diagram of an EEPROM according to a second embodiment of the present invention.
Figure 4:
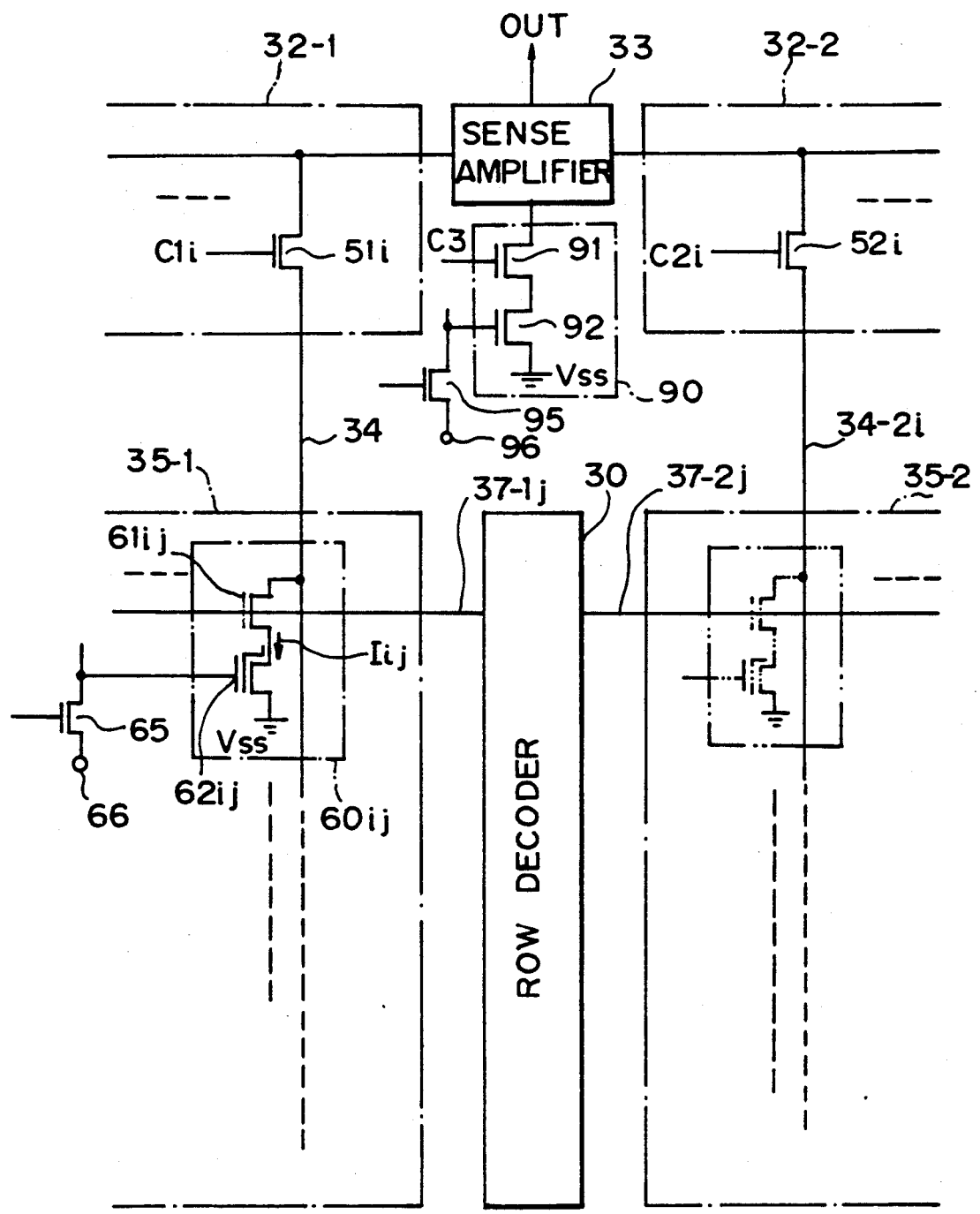
FIG. 4 is a circuit diagram showing a principal portion of the EEPROM of FIG. 3.

Second Embodiment (FIGS. 3 to 4)

A semiconductor memory cell according to a second embodiment of the present invention will be described with reference to FIGS. 3 to 4. The constituents which are same as those of the first embodiment are designated at same numerals and explanation thereof is omitted.

The arrangement of the semiconductor memory cell is same as that of the first embodiment except that the former is provided with one dummy memory cell 90 comprising transistors 91, 92. Accordingly, the sense amplifier 33A differentially amplifies data in the memory cell 60$ij$ selected from the first memory array 35-$i$ or the second memory array 35-2 and data in a dummy memory cell 90. The address A5 functions to select the first memory array 35-1 or the second memory array 35-2 and applies a signal C3 to a gate of a transistor 91 for selecting a transistor 92.

The semiconductor memory cell having such an arrangement according to the second embodiment operates in the same manner as that of the first embodiment.

It is possible to measure the threshold of the memory cell more accurately than the semiconductor memory cell of the first embodiment since the semiconductor memory cell of the second embodiment is provided with a single dummy cell 90 whereby the transistor 92 is compared with the transistor 62$ij$ of the memory cell 60$ij$.

Although the invention has been described in its preferred form with a certain degree of particularity, it is to be understood that many variations and changes are possible in the invention without departing from the scope thereof.

What is claimed is:

1. A method for evaluating a memory cell of a semiconductor memory device, the method comprising the steps of:
    preparing the semiconductor memory device employing the memory cell and a dummy cell, said memory device having an input terminal coupled to the dummy cell, said memory and dummy cells each having a respective gate electrode, the gate electrode of said dummy cell being coupled to said input terminal;
    writing a logic ZERO into the memory cell;
    applying a first voltage to the gate electrode of the memory cell so that the memory cell develops a first current therein;
    externally applying a second voltage to the gate electrode of the dummy cell through said input terminal so that the dummy cell develops a second current therein; and
    externally increasing the value of the second voltage until the second current just exceeds the first current at a first time, whereby the value of the second voltage at the first time can be obtained as a characteristic value of the memory cell of the semiconductor memory.

2. A method according to claim 1 wherein said increasing step is gradually executed.

3. A method according to claim 1 wherein said increasing step includes a step of detecting that the second current exceeds the first current.

4. A method according to claim 3 wherein said detecting step is executed by a sense amplifier.

5. A method according to claim 1 wherein said increasing step is executed while the first voltage is constantly maintained.

6. A method according to claim 1, further comprising the steps of:
    writing a logic ONE into the memory cell;
    applying a third voltage to the gate electrode of the memory cell so that the memory cell develops a third current therein;
    externally applying a fourth voltage to the gate electrode of the dummy cell through said input terminal so that the dummy cell develops a fourth current therein; and
    externally increasing the value of the third voltage until the third current just exceeds the fourth current at a second time, whereby the value of third voltage at the second time can be obtained as another characteristic value of the memory cell of the semiconductor memory.

7. A method for evaluating a memory cell of a semiconductor memory device, the method comprising the steps of:

preparing the semiconductor memory device employing the memory cell and a dummy cell, the memory device having an input terminal coupled to the dummy cell, said memory and dummy cells each having a respective gate electrode, the gate electrode of said dummy cell being coupled to said input terminal;

writing a logic ZERO into the memory cell;

applying a first voltage to the gate electrode of the memory cell so that the memory cell develops a first current therein;

externally applying a second voltage to the gate electrode of the dummy cell through said input terminal so tat the dummy cell develops a second current therein;

externally increasing the value of the second voltage until the second current just exceeds the first current at a first time, whereby the value of the second voltage at the first time can be obtained as a characteristic value of the memory cell of the semiconductor memory;

writing a logic ONE into the memory cell;

applying a third voltage to the gate electrode of the memory cell so that the memory cell develops a third current therein;

externally applying a fourth voltage to the gate electrode of the dummy cell through said input terminal so that the dummy cell develops a fourth current therein; and externally increasing the value of the third voltage until the third current just exceeds the fourth current at a second time, whereby the value of the third voltage at the second time can be obtained as a characteristic value of the memory cell of the semiconductor memory;

8. A method according to claim 7 wherein said increasing step is gradually executed.

9. A method according to claim 7 wherein said increasing step includes a step of detecting that the second current exceeds the first current.

10. A method according to claim 9 wherein said detecting step is executed by a sense amplifier.

11. A method according to claim 7 wherein said increasing step is executed while the first voltage is constantly maintained.

12. A method for evaluating a memory cell of a semiconductor memory device, the method comprising the steps of:

preparing the semiconductor memory device employing the memory cell and a dummy cell, the memory device having an input terminal coupled to the dummy cell, said memory and dummy cells each having a respective gate electrode, the gate electrode of said dummy cell being coupled to said input terminal;

writing a logic ZERO into the memory cell; applying a first voltage to the gate electrode of the memory cell so that the memory cell develops a first current therein;

externally applying a second voltage to the gate electrode of the dummy cell through said input terminal so tat the dummy cell develops a second current therein; and externally varying the value of the second voltage until the second current is substantially equivalent to the first current at a first time, whereby the value of the second voltage at the first time can be obtained as a characteristic value of the memory cell for the semiconductor memory.

13. A method according to claim 12 wherein said varying step is gradually executed.

14. A method according to claim 12 wherein said varying step includes a step detecting that the second current exceeds the first current.

15. A method according to claim 14 wherein said detecting step is executed by a sense amplifier.

16. A method according to claim 12 wherein said varying step is executed while the first voltage is constantly maintained.

17. A method according to claim 12, further comprising the steps of:

writing a logic ONE into the memory cell;

applying a third voltage to the gate electrode of the memory cell so that the memory cell develops a third current therein;

externally applying a fourth voltage to the gate electrode of the dummy cell through said input terminal so that the dummy cell develops a fourth current therein; and externally varying the value of the third voltage until the third current just exceeds the fourth current at a second time, whereby the value of third voltage at the second time can be obtained as another characteristic value of the memory cell for the semiconductor memory.

18. A method for evaluating a memory cell of a semiconductor memory device, the method comprising the steps of:

preparing the semiconductor memory device employing the memory cell and a dummy cell, said memory device having an input terminal coupled to the dummy cell, said memory and dummy cells each having a respective gate electrode, the gate electrode of said dummy cell being coupled to said input terminal;

writing a logic ZERO into the memory cell;

applying a first voltage to the gate electrode of the memory cell so that the memory cell develops a first current therein;

externally applying a second voltage to the gate electrode of the dummy cell through said input terminal so that the dummy cell develops a second current therein;

externally varying the value of the second voltage until the second current just exceeds the first current at a first time, whereby the value of second voltage at the first time can be obtained as another characteristic value of the memory cell for the semiconductor memory;

writing a logic ONE into the memory cell;

applying a third voltage to the gate electrode of the memory cell so that the memory cell develops a third current therein;

externally applying a fourth voltage to the gate electrode of the dummy cell so that the dummy cell develops a fourth current therein; and externally varying the value of the third voltage until the third current just exceeds the fourth current at a second time, whereby the value of third voltage at the second time can be obtained as another characteristic value of the memory cell for the semiconductor memory.

19. A method according to claim 18 wherein said varying step is gradually executed.

20. A method according to claim 18 wherein said varying step includes a step of detecting that the second current exceeds the first current.

21. A method according to claim 20 wherein said detecting step is executed by a sense amplifier.

22. A method according to claim 18 wherein said varying step is executed while the first voltage is constantly maintained.

* * * * *